United States Patent [19]
Gould et al.

[11] Patent Number: 5,717,346
[45] Date of Patent: Feb. 10, 1998

[54] LOW SKEW MULTIPLEXER NETWORK AND PROGRAMMABLE ARRAY CLOCK/RESET APPLICATION THEREOF

[75] Inventors: Scott Whitney Gould, South Burlington, Vt.; Frederick Curtis Furtek, Menlo Park, Calif.; Frank Ray Keyser, III, Colchester, Vt.; Brian A. Worth, Milton, Vt.; Terrance John Zittritsch, Williston, Vt.

[73] Assignees: International Business Machines Corporation, Armonk, N.Y.; Atmel Corporation, San Jose, Calif.

[21] Appl. No.: 709,074

[22] Filed: Sep. 6, 1996

Related U.S. Application Data

[62] Division of Ser. No. 459,156, Jun. 2, 1995, Pat. No. 5,652,529.

[51] Int. Cl.⁶ .................................................. H03K 19/00
[52] U.S. Cl. .............................. 326/93; 326/101; 327/295
[58] Field of Search ................................ 326/93, 101, 41, 326/47; 327/262, 269, 295, 297

[56] References Cited

U.S. PATENT DOCUMENTS

| | | |
|---|---|---|
| Re. 34,363 | 8/1993 | Freeman . |
| 4,371,797 | 2/1983 | Frank . |
| 4,609,986 | 9/1986 | Hartmann et al. .................. 364/200 |
| 4,617,479 | 10/1986 | Hartmann et al. . |
| 4,709,173 | 11/1987 | Nishimichi et al. . |
| 4,758,745 | 7/1988 | Elgamal et al. . |
| 4,769,558 | 9/1988 | Bach .................................. 327/297 |
| 4,774,421 | 9/1988 | Hartmann et al. . |
| 4,855,619 | 8/1989 | Hsieh et al. . |
| 4,912,342 | 3/1990 | Wong et al. . |
| 4,963,770 | 10/1990 | Keida . |
| 5,013,942 | 5/1991 | Nishimura et al. .................. 327/297 |
| 5,023,484 | 6/1991 | Pathak et al. . |
| 5,046,035 | 9/1991 | Jigour et al. ........................ 364/716 |
| 5,055,718 | 10/1991 | Galbraith et al. . |
| 5,073,729 | 12/1991 | Greene et al. . |
| 5,122,679 | 6/1992 | Ishii et al. ............................ 327/295 |
| 5,122,685 | 6/1992 | Chan et al. . |
| 5,144,166 | 9/1992 | Camarota et al. . |
| 5,172,330 | 12/1992 | Watanabe et al. .................. 326/101 |
| 5,245,227 | 9/1993 | Furtek et al. . |
| 5,254,886 | 10/1993 | El-Ayat et al. . |
| 5,307,381 | 4/1994 | Ahuja .................................. 375/356 |
| 5,309,046 | 5/1994 | Steele .................................. 326/39 |
| 5,319,254 | 6/1994 | Goetting . |
| 5,329,460 | 7/1994 | Agrawal et al. .................... 364/489 |
| 5,332,929 | 7/1994 | Chiang . |
| 5,347,519 | 9/1994 | Cooke et al. ........................ 371/22.2 |
| 5,457,409 | 10/1995 | Agrawal et al. .................... 326/41 |
| 5,506,517 | 4/1996 | Tsui et al. ............................ 326/56 |

OTHER PUBLICATIONS

"Field Programmable Gate Arrays—AT6000 Series," Atmel Corporation, San Jose, pp. 1–16, Copyright 1993.

Motorola, "Product Brief, MPA10xx Field Programmable Gate Arrays," dated Sep. 27, 1993.

Payton, M., "The Motorola FPGA," Briefing, 22 pages, dated Sep. 14, 1993.

*Primary Examiner*—Edward P. Westin
*Assistant Examiner*—Jon Santamauro
*Attorney, Agent, or Firm*—Heslin & Rothenberg, P.C.

[57] ABSTRACT

A signal distribution architecture for clock and reset signal distribution in a programmable array is disclosed. The architecture includes separate networks for distributing clock and reset signals to logic cells of the array. Each network includes a plurality of column multiplexers for selecting a column clock or reset signal from a plurality of system clock or reset signals. Within each column of logic cells are positioned sector multiplexers for selecting a sector clock or reset signal from a plurality of column clock or reset signals. The clock and reset signals are applied to the combinatorial and sequential logic circuits of each logic cell associated with a given sector multiplexer. A clock gate circuit is controlled cooperatively with an output multiplexer in each logic cell. The networks are designed with features to minimize signal skew including signal source buffering, multiplexer signal buffering and output driver sizing as a function of signal propagation distance.

21 Claims, 9 Drawing Sheets

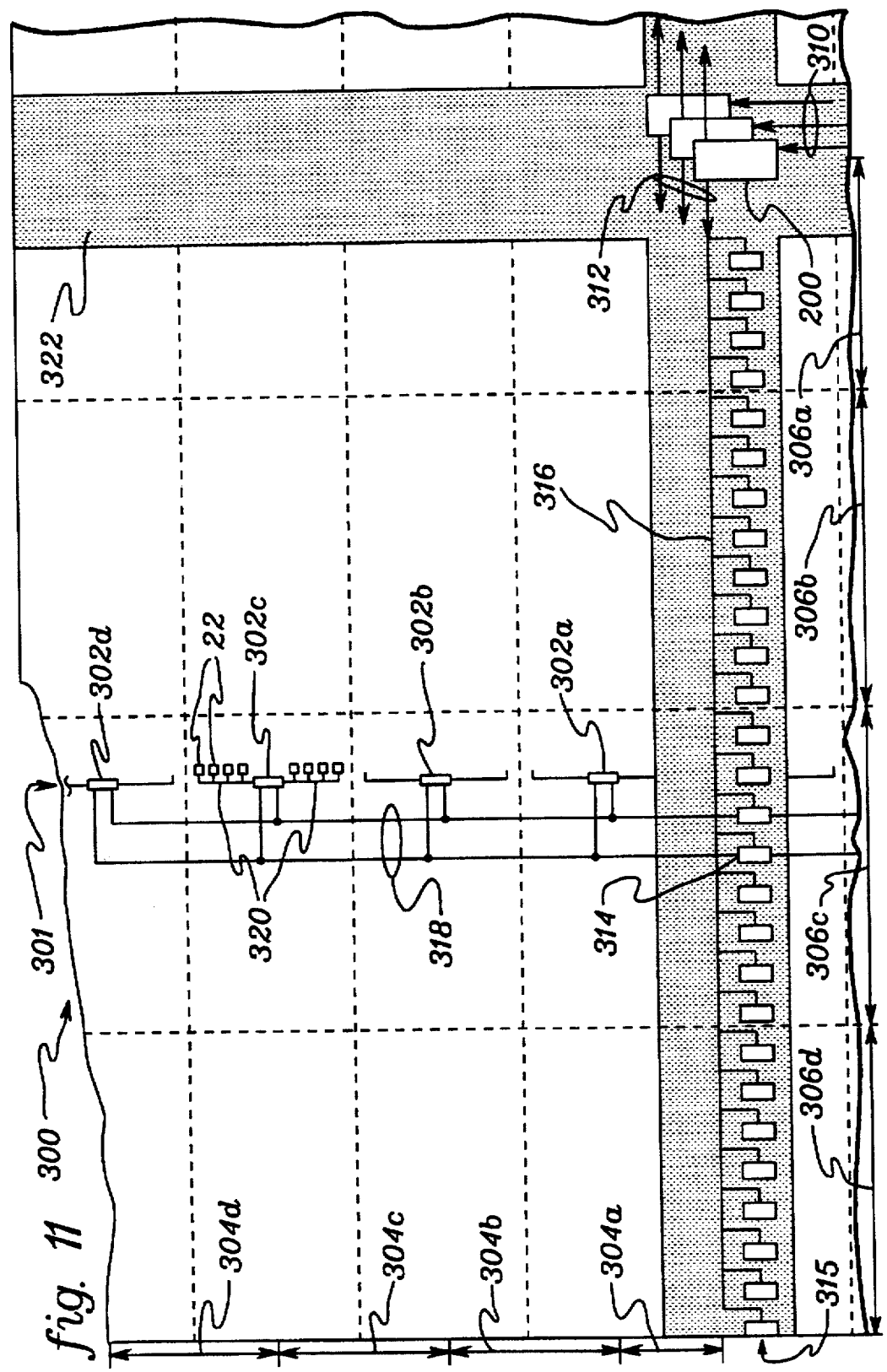

LOW SKEW MULTIPLEXER NETWORK AND PROGRAMMABLE ARRAY CLOCK/ RESET APPLICATION THEREOF

RELATED APPLICATION INFORMATION

This application is a division of U.S. patent application Ser. No. 08/459,156, filed on Jun. 2, 1995, now U.S. Pat. No. 5,652,529 and relates to commonly owned concurrently filed U.S. Patent applications:
1. Ser. No.: 08/460,481, Docket No.: BU9-95-019, entitled "PROGRAMMABLE LOGIC CELL;" and
2. Ser. No.: 08/459,579, Docket No.: BU9-95-025 entitled "PROGRAMMABLE ARRAY INTERCONNECT NETWORK"; and
3. Ser. No.: 08/460,420, Docket No.: BU9-95-023, entitled "PROGRAMMABLE ARRAY I/O ROUTING RESOURCE."

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit devices, and, more specifically, to a clock and reset signal distribution architecture for programmable integrated circuit devices including those having a plurality of programmable logic cells.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field." Such configuration may be effected by using electrically programmable fusible links, antifuses, memory-controlled transistors, floating-gate gate transistors, or the like. The cells of a PGA can be any type of known logic cells, including AND/OR macrocells as in PALs or PLAs.

Each logic cell of an array often includes combinatorial and sequential logic stages. In one common implementation, a cell sequential stage is cascaded with a cell combinatorial stage. The combinatorial stage performs logic functions on cell inputs, and the sequential stage is used to store and output the result. The sequential stages of the logic cells (e.g., flip-flops) often require, in addition to data inputs and outputs, clock and reset signals for proper operation.

In many prior approaches, a single clock and a single reset signal are applied to respective input pads of the array and are internally routed to each sequential stage of the array. The user programmed designs employing these arrays are therefore constrained to single clock and reset implementations. Each portion of the array, even if logically partitioned from the other portions, is nevertheless required to conform to an array-wide clock and reset strategy. The likelihood of logically partitioned arrays increases with advances in semiconductor technology which allow increased logic cell density.

Additionally, because the densities and clock speeds of programmable arrays are increasing with advances in semiconductor technology, array-wide timing tolerances are decreasing. The propagation delay associated with clock or reset signals routed from a signal source (e.g., a chip pad) to a logic cell varies in proportion to the distance between the logic cell and the clock or reset signal source. Since the logic cells are necessarily distributed over the available substrate area in an array, the distances between the logic cells and the clock or reset signal source will vary. This variance causes skew between the signals routed to logic cells which may be outside of the timing tolerances of dense, high-speed arrays.

What is needed, therefore, is a flexible clock and reset distribution architecture which overcomes the limitations of the array-wide designs of the prior approaches, and which employs techniques to minimize the clock and reset signal skew across the array.

SUMMARY OF THE INVENTION

Briefly described, the invention, in one aspect, comprises a programmable array having a plurality of logic cells arranged in rows and columns therein. The programmable array includes a clock/reset distribution network including a first programmable column multiplexer for each column of logic cells, each programmable column multiplexer serving to select a column clock/reset signal from a plurality of system clock/reset signals and providing a selected column clock/reset signal to the respective column of logic cells.

A first plurality of programmable sector multiplexers is provided for each column of logic cells. Each programmable sector multiplexer corresponds to a sector of logic cells of the respective column of logic cells and selects a sector clock/reset signal from a plurality of selected column clock/reset signals and provides the selected sector clock/reset signal to the respective sector of logic cells. The distribution network can be used for either clock or reset signals. At least one of the first programmable column multiplexers may include a constant logic state input wherein the column clock/reset signal is selected from the plurality of system clock/reset signals and from the constant state logic input. At least one of the first programmable column multiplexers may also include an input derived from an interconnect structure of the programmable array, wherein the column clock/reset signal is selected from the plurality of system clock/reset signals and the derived input.

The programmable array may also include an I/O block for accepting at least one system clock/reset signal, and a programmable element connected between the I/O block and the clock/reset distribution network for selectively providing the at least one system clock/reset signal to the clock/reset distribution network from the I/O block.

In another aspect of the invention, a programmable array is provided including a first plurality of logic cells wherein each of the logic cells includes a programmable input multiplexer having a plurality of inputs and an output. Each cell may include a combinatorial logic circuit having an input connected to the output of the programmable input multiplexer and further having an output, and a sequential logic circuit having an input connected to the output of the combinatorial logic circuit and further having a clock/reset input. A programmable clock/reset multiplexer is associated with the first plurality of logic cells for providing a selected clock/reset signal to an input of the programmable input multiplexer of each of the first plurality of logic cells and to the clock/reset input of the sequential logic circuit of each of the first plurality of logic cells.

In yet another aspect of the invention, a programmable array is provided having a clock/reset distribution network for-distributing at least one clock/reset signal to a plurality of logic cells. At least one logic cell of the plurality of logic cells includes a programmable output multiplexer having a plurality of inputs, an output, and a control element. The cell also includes a sequential logic circuit having an output connected to one of the plurality of inputs of the programmable output multiplexer and a clock/reset signal input. A clock/reset gate circuit is provided, connected between the clock/reset signal input of the sequential logic circuit and the clock/reset distribution network, for gating a clock/reset signal into the sequential logic circuit in response to the control element of the programmable output multiplexer.

In still another aspect of the invention, a programmable multiplexer for a programmable array is provided. The programmable multiplexer includes a plurality of signal paths, each path including an input and an output. At least one of the input paths includes an input inverter connected to the input of the signal path and an output. A programmable element is provided having a first current carrying terminal connected to the output of the input inverter and further having a second current carrying terminal, the second current carrying terminal comprising an output of the at least one signal path. An output inverter is provided having an input connected to the outputs of each of the plurality of signal paths, the output inverter further having an output which comprises the output of the multiplexer such that a selected signal can be re-driven through the at least one programmable multiplexer. In one embodiment, the programmable element includes a transmission gate controlled by an SRAM cell.

In still another aspect of the invention, a low-skew signal distribution architecture for an integrated circuit is provided. The architecture includes a signal source, a first plurality of primary distribution circuits, each having an output stage, and a first conductive path between the signal source and each primary distribution circuit. A signal transmitted from the signal source reaches each respective distribution circuit after a respective delay, each respective delay being generally proportional to a respective propagation distance along each first conductive path from the signal source to the respective primary distribution circuit. The output stage of each respective primary distribution circuit is sized as a function of the respective propagation distance along the first conductive path to compensate for the respective delay such that skew is minimized for signals output from the first plurality of primary distribution circuits. The output stages may be sized as a function of the region in which the distribution circuit is located in an integrated circuit.

The architecture may be employed in a programmable array having a clock/reset distribution architecture which comprises the low-skew signal distribution architecture discussed above. In the programmable array implementation, at least some of the primary distribution circuits comprise programmable multiplexers.

By employing the disclosed low-skew signal distribution architectures for clock and reset distribution in a programmable array, skew is minimized between clock and reset signals applied to the logic cells of the programmable array, and a flexible multiplexing approach can be employed to provide greater clock and reset distribution options within the array.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

FIG. 11 depicts the physical arrangement of the signal distribution circuits in a quadrant of a programmable array in accordance with the present invention.

DESCRIPTION OF THE PREFERRED EMBODIMENT(S)

Figure 1:
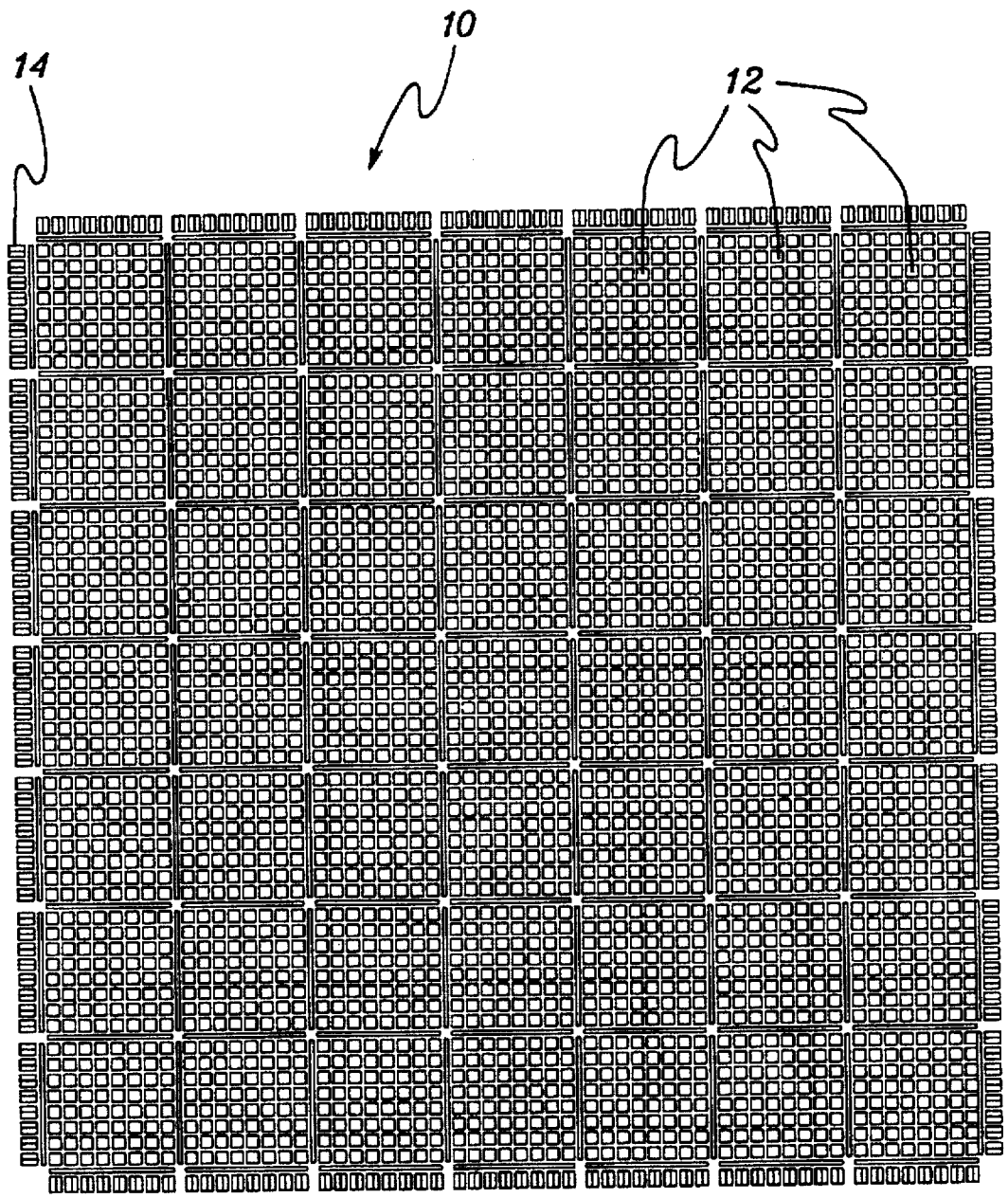
FIG. 1 depicts a programmable array having a plurality of logic cells arranged therein.

With reference to FIG. 1, there is shown a layout of an integrated circuit programmable gate array 10 comprising a plurality of programmable logic cells 12. In this particular embodiment, the plurality of programmable logic cells comprises a 56×56 array of cells divided into sectors of cells, wherein each sector is defined by an 8×8 group of cells. The programmable logic cells of the array can be implemented according to the above-incorporated portions of the U.S. Patent application entitled "PROGRAMMABLE LOGIC CELL," or can be any type of known logic cells, including AND/OR macrocells as in PALs or PLAs. Also depicted are the input/output ("I/O") blocks 14 along the perimeter of the array which are used for data input and output. The I/O portions of the array can be implemented according to the above-incorporated portions of the U.S. Patent application entitled "PROGRAMMABLE ARRAY I/O ROUTING RESOURCE."

Figure 2:
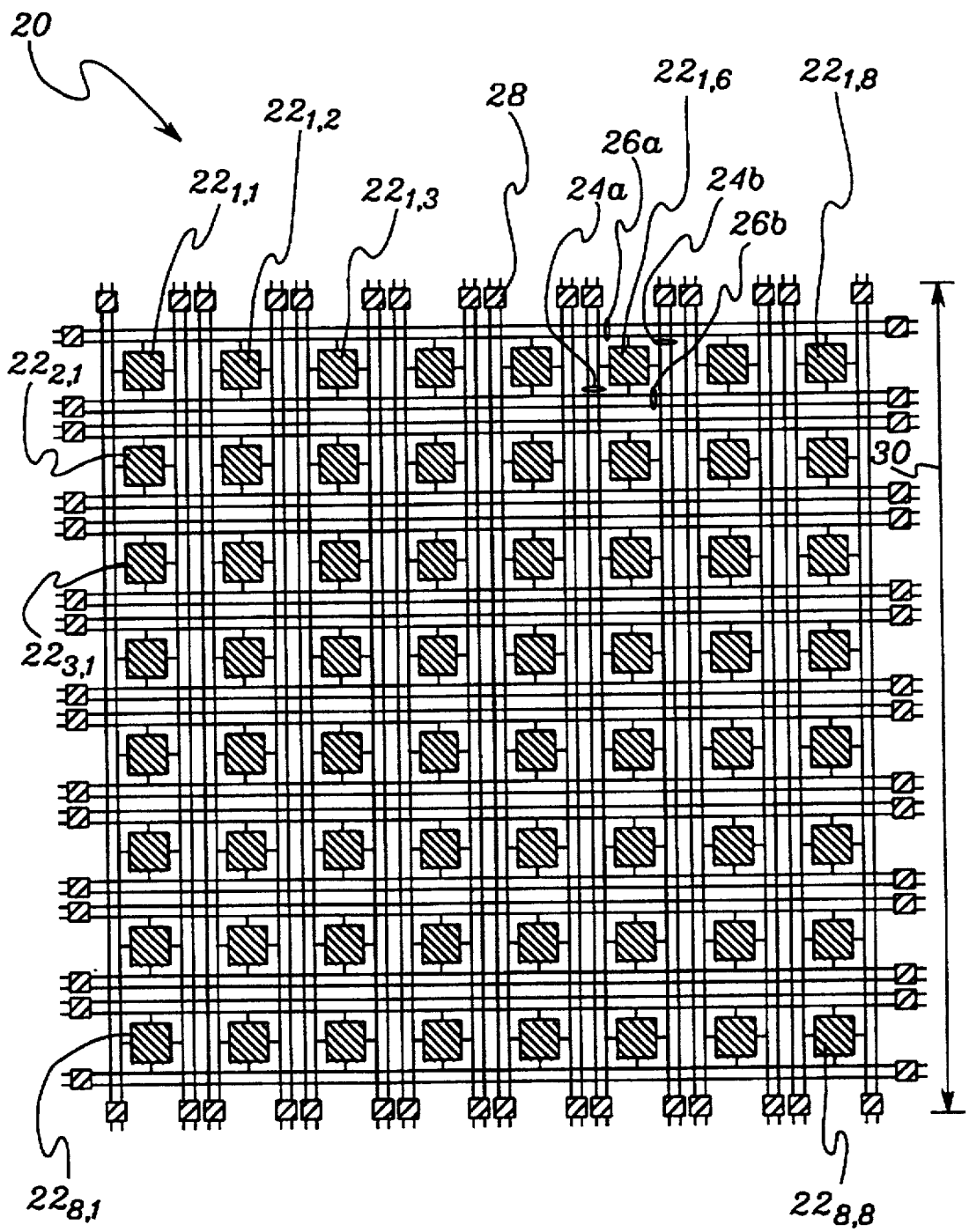
FIG. 2 depicts a sector of logic cells of the array of FIG. 1.

With reference to FIG. 2, there is shown a single sector 20 of programmable logic cells of the array of FIG. 1. A single sector comprises logic cells $22_{1,1}$ to $22_{8,8}$ arranged in rows and columns of contiguous, but not necessarily abutting, logic cells. With reference to logic cell $22_{1,6}$, the cell is shown generally surrounded by exemplary vertical interconnect buses 24a and 24b, and horizontal interconnect buses 26a and 26b. These horizontal and vertical interconnect buses are positioned between each row and column of the array and provide connections between any two logic cells in the array, or between any logic cell in the array and the I/O blocks. The interconnect buses together form the overall programmable interconnect network of the programmable array. The interconnect network can be formed according to the above-incorporated portions of the U.S. Patent Application entitled "PROGRAMMABLE ARRAY INTERCONNECT NETWORK." Dimension 30 merely represents a sector of logic cells in any of the depicted columns.

Figure 3:
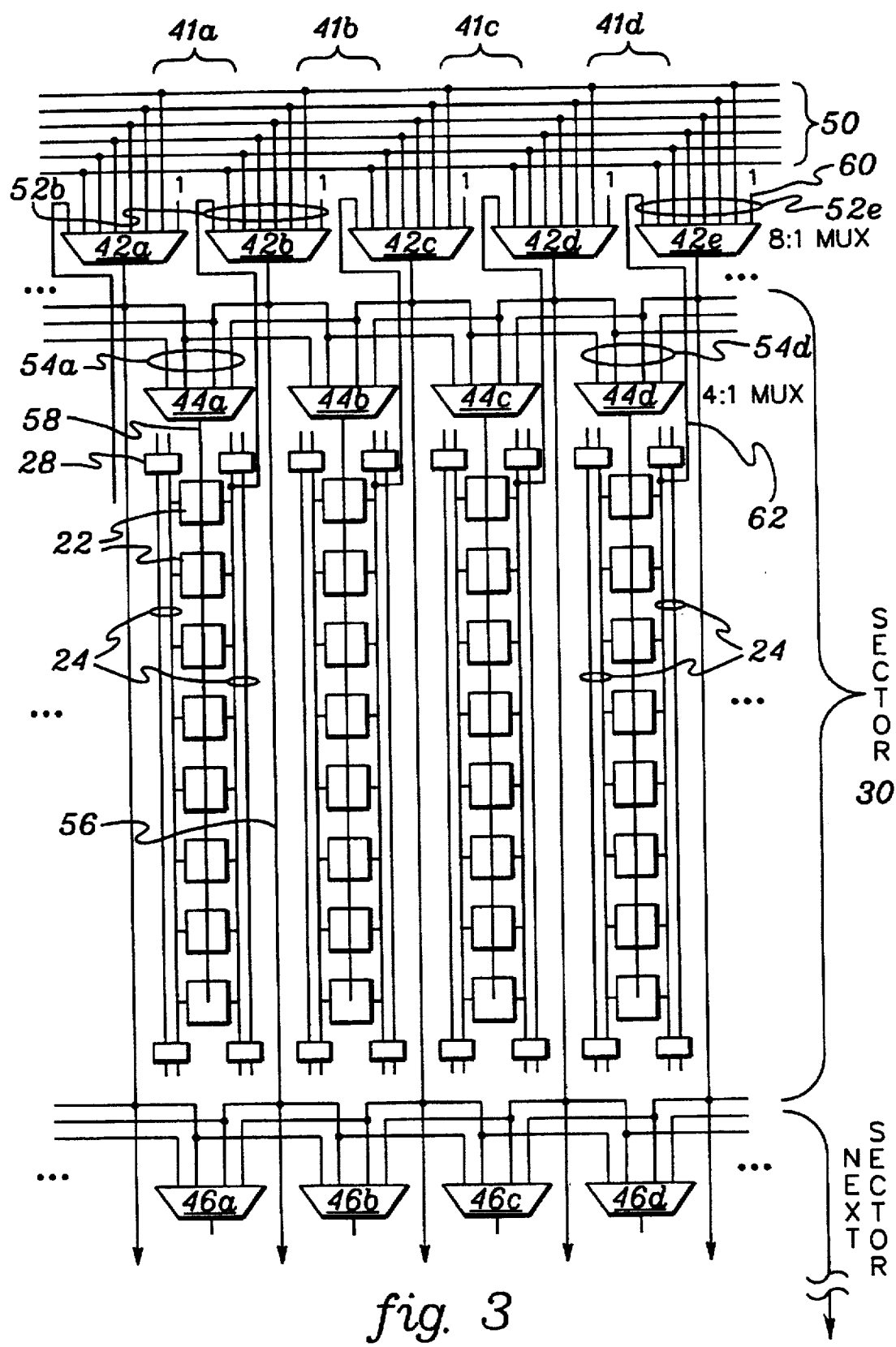
FIG. 3 depicts a portion of a programmable clock distribution network for a programmable array in accordance with the present invention.
Figure 4:
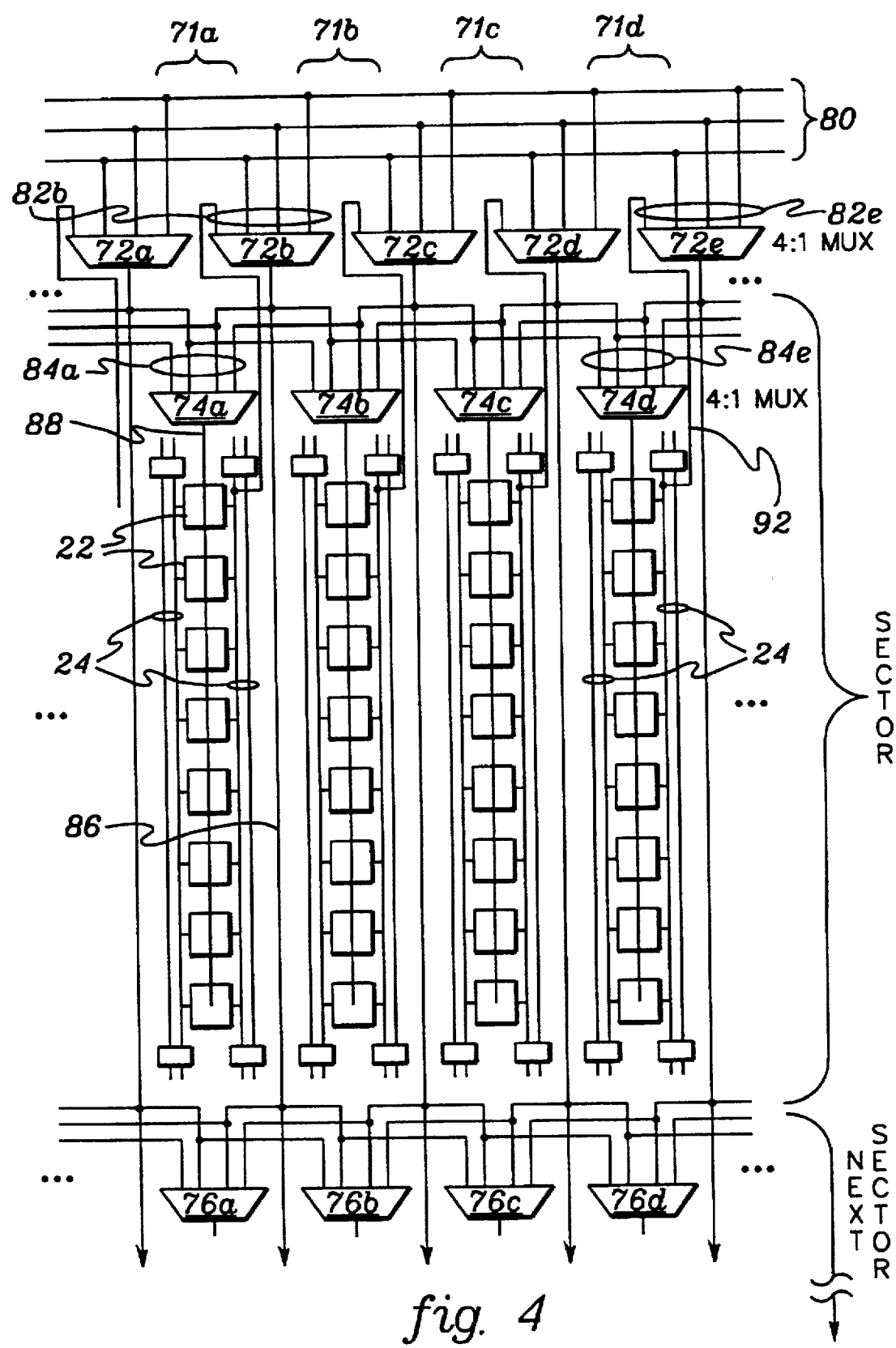
FIG. 4 depicts a portion of a programmable reset distribution network for a programmable array in accordance with the present invention.

Pursuant to the principles of the present invention, a flexible signal distribution architecture for integrated circuits is provided. In one embodiment, the architecture is employed in a programmable array having a plurality of logic cells, and is used to distribute clock and reset signals to the logic cells. The architecture in this embodiment includes a network for distributing clock signals throughout the array. FIG. 3 illustrates an example of a clock signal distribution network. The architecture may also include a separate, but similar, network for distributing reset signals throughout the array. FIG. 4 illustrates an example of a reset signal distribution network. One skilled in the art will recognize that the networks of FIGS. 3-4 are similar, and that either network can be used for clock or reset signal distribution without departing from the principles of the present invention.

The designation "clock/reset," when used alone herein, denotes either a clock or a reset. The designations "clock/reset" and "reset/clock," when used together herein, denote either (1) a clock and a reset, or (2) a reset and a clock. This convention is similarly used for other terms. Thus, the network of FIG. 3 could be considered a clock/reset network, and the related network of FIG. 4 could be considered a reset/clock network.

With reference to FIG. 3, depicted therein are portions of four columns 41a-d of logic cells. Only a single sector 30 of each of the columns is depicted. As discussed above, the logic cells 22 have associated therewith vertical interconnect buses 24. Horizontal interconnect buses (not shown) can also be provided. In an exemplary array embodiment, a sector of logic cells is generally defined by the placement of repeaters or switches 28. Those skilled in the art will recognize that the term "sector" can denote any arbitrary partition of logic cells in a repetitive array of logic cells. Each column of cells, and the cells of a particular sector within each column, can thus be generally considered as groups and sub-groups of logic cells, respectively. The clock distribution network includes multiplexers 42, 44 and 46, and all of the connections therebetween. System clock signals 50 (six, in this embodiment) are each provided as a portion of inputs 52a-e to column multiplexers 42a-e. (The sources of clock signals 50 are discussed further below in connection with FIGS. 9-10.) The column multiplexers 42 are programmable and can selectively apply the signal present at a selected input to an output. For example, multiplexer 42b selects from signal group 52b a column clock signal 56 which is routed along the entire column 41a of logic cells.

Pursuant to the principles to the present invention each selected column clock is applied to secondary or sector multiplexers 44, 46, etc. For sector 30, sector multiplexers 44a-d are depicted. For the next sector down, sector multiplexers 46a-d are depicted. Sector multiplexer 44a selects from signal group 54a and provides a sector clock signal 58 which is applied to each of the eight logic cells within the sector of logic cells. Pursuant to the principles of the present invention, the inputs to multiplexers 44 include the column clock associated with the respective column, as well as column clocks from other columns. For example, clock signals from the immediately adjacent columns, and clocks from up to two columns away are shown as inputs to each multiplexer 44. The sizes of the multiplexers 44 can be arbitrarily increased to accept inputs from any number of columns. In the preferred embodiment, sector multiplexers 44 include four inputs. Thus, the respective column clock (from multiplexer 42c), the column clock from the immediately adjacent column multiplexer 42d to the right, and the column clocks from the two immediately adjacent column multiplexers 42a and 42b on the left are provided as inputs to multiplexer 44b. This pattern can be maintained within each sector of the array, for example, using multiplexers 46 in the next sector down.

In addition to the system clock signals 50, each column multiplexer 42 can accept a derived clock input and a constant state logic input. For example, as shown in FIG. 3, an input 62, i.e., a derived input, is also available as shown for multiplexer 42e from interconnect buses 24. A similar signal can be provided for each column multiplexer 42. Thus, a clock or data signal from the general interconnect network can be applied to each column multiplexer. In addition, a constant logic state signal 60 can also be applied to column multiplexers. (Those skilled in the art will recognize that, in the interest of clarity, certain repetitive features in all of the drawings herein are not given individual reference numerals, e.g., signal 60).

Depicted in FIG. 4 is a reset network of the signal distribution architecture of the present invention for columns 71a-d of an array. The reset network includes column multiplexers 72 and sector multiplexers 74 and 76 which are arranged similarly to multiplexers 42, 44 and 46 of FIG. 3, respectively. Column multiplexers 72a-e accept system reset signals 80 as part of input signal groups 82a-e. A column reset signal, e.g., line 86, is selected from the input signal group 82b for a respective column 71a of the array. In this exemplary embodiment, only three system reset signals 80 are provided to column reset multiplexers 72. A fourth input 92, i.e., a derived input, is also available as shown for multiplexer 72e from interconnect buses 24. A similar signal can be provided for each column multiplexer 72. Multiplexers 74 and 76 are arranged similarly to multiplexers 44 and 46 of FIG. 3. For example, multiplexer 74a selects from four input signals 84a and produces sector reset signal 88 to be applied to each of the respective logic cells within the sector of the respective column of logic cells. Again, as discussed above, multiplexer 74b receives its own respective column reset (from multiplexer 72c) as an input, as well as other column reset signals. For example, one column reset signal from the immediately adjacent column multiplexer 72d on the right, and reset signals from the two-immediately adjacent column multiplexers 72a and 72b on the left are provided to multiplexer 74b.

Figure 5:
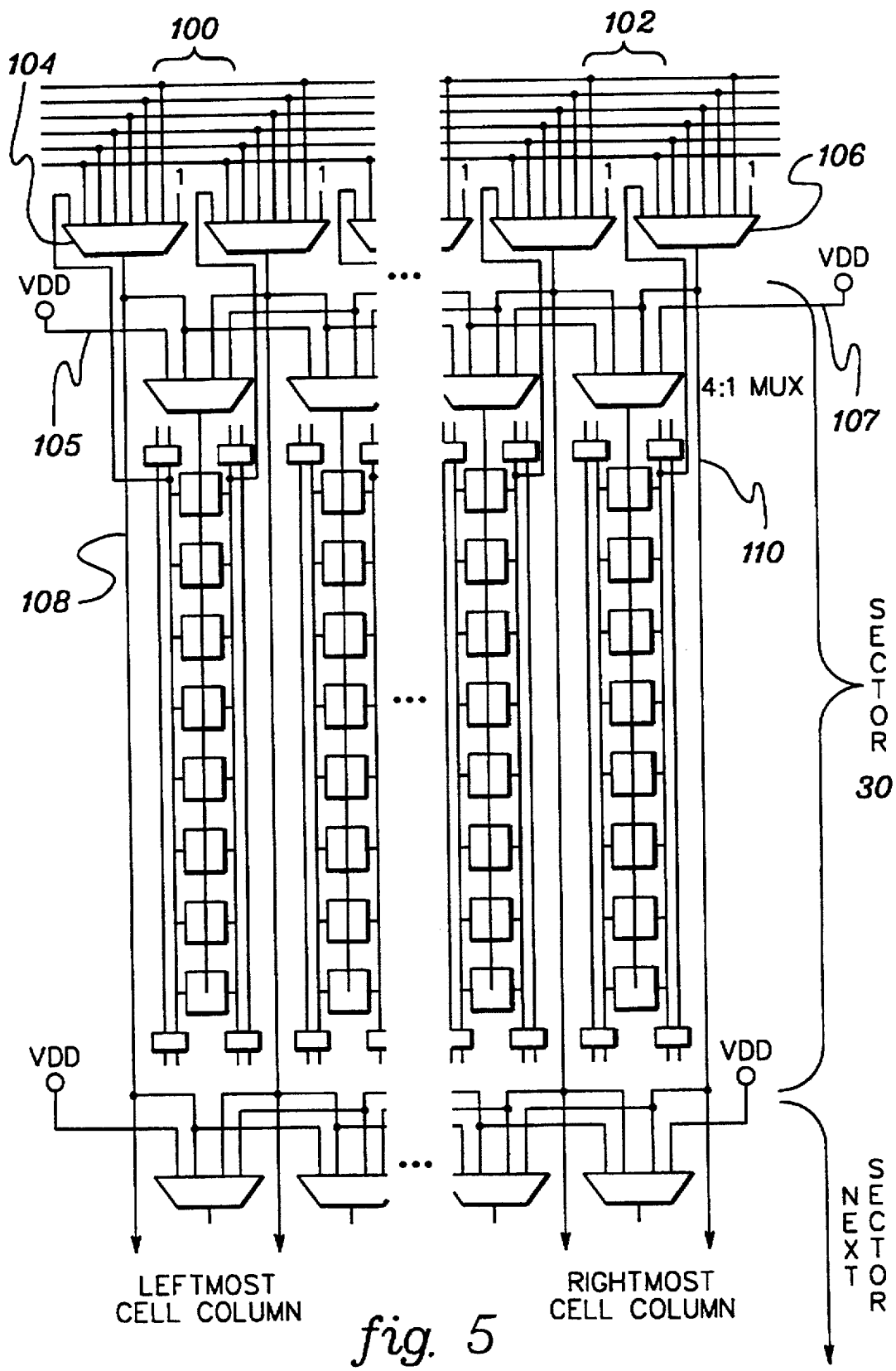
FIG. 5 depicts the perimeter conditions for either of the distribution networks of FIGS. 3 or 4.

FIG. 5 depicts the array perimeter conditions of either the clock or reset network discussed above with reference to FIGS. 3 and 4. Adhering to the conventions established above, column 102 has associated therewith a column multiplexer 106 and a column clock signal 110, both shown positioned to the right of column 102. The leftmost column 100 similarly has a column multiplexer and clock located to, the right, but also has an additional column multiplexer 104 and an additional column clock 108 located on its left. Thus, for the array of FIG. 1 which contains 56 columns, 57 column multiplexers and column clock signals could be distributed therethrough. The extra inputs 105 and 107 to the sector multiplexers at the perimeter are merely tied to $V_{DD}$.

Those skilled in the art will recognize that the illustrations of the networks in FIGS. 3–5 represent the logical relationship between the signal sources and destinations. The actual physical layout of the described components may differ significantly from FIGS. 3–5. One exemplary layout is discussed below with reference to FIG. 11.

Figure 6:
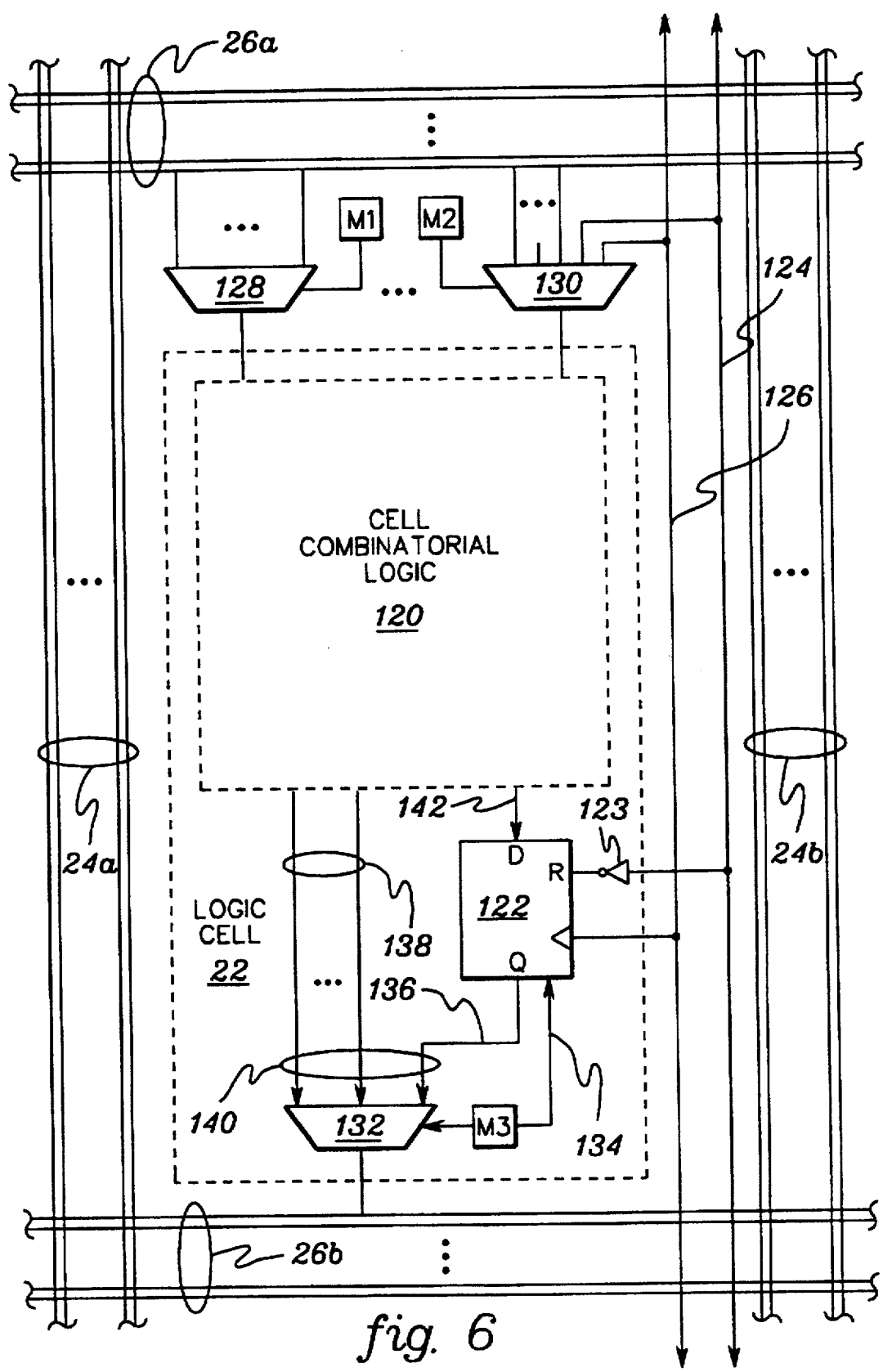
FIG. 6 depicts the connections between a logic cell and the column clock and reset signals in accordance with the present invention.

FIG. 6 depicts additional detail of a single logic cell 22 which has associated therewith interconnect buses 24a–b and 26a–b as discussed above. The logic cell also may have associated input multiplexers 128 and 130 (controlled by memory blocks M1–M3 in a preferred embodiment) for connecting cell combinatorial logic 120 to selected interconnect bus signals. The outputs of the cell combinatorial logic 120 can include outputs 138 and 142. Outputs 138 can be simply applied to an output multiplexer 132 while output 142 can be applied to a sequential circuit, e.g., a flip-flop 122. In accordance with the principles of the present invention, column clock line 126 and column reset line 124 run proximate to cell 22 and signals therefrom are applied both to the combinatorial logic through multiplexer 130 as well as to the sequential logic 122. Thus, clock signals are available for processing within the cell combinatorial logic, and clock signals are also provided for standard operation of sequential logic 122. The output 136 of sequential logic 122 can also be applied to cell output multiplexer 132. Thus, an output signal selected from signals 140 is provided from output multiplexer 132 back into an interconnect bus 26b.

Figure 7:
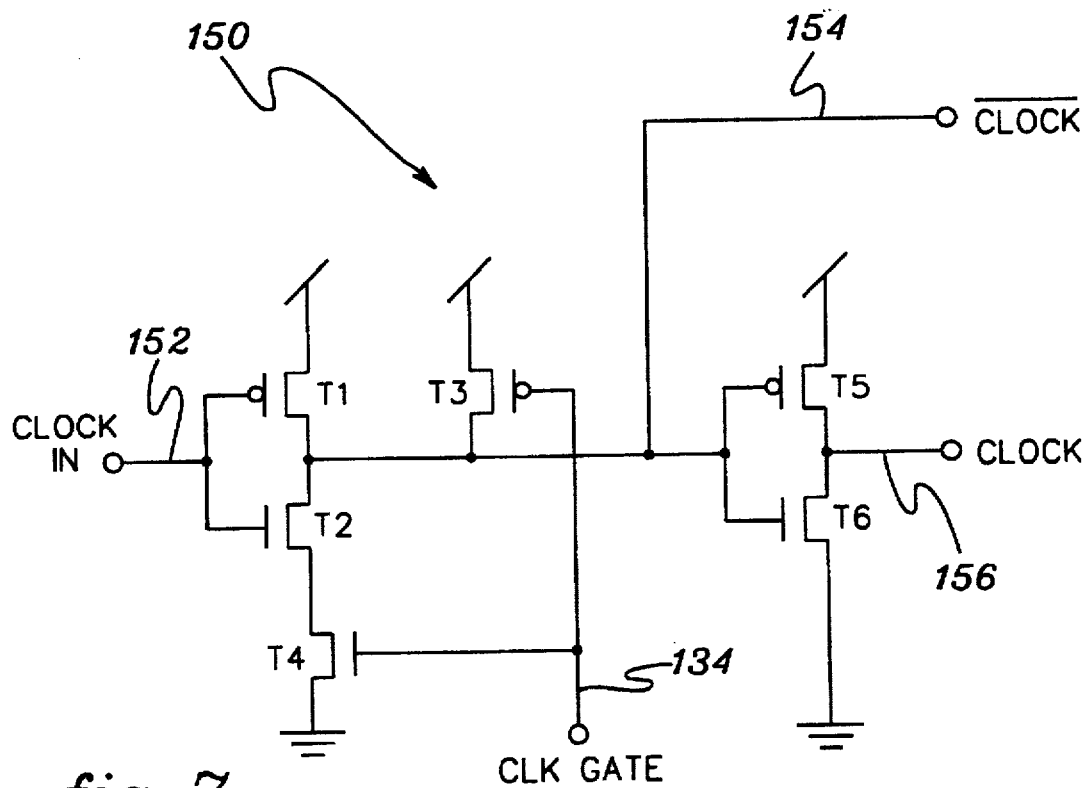
FIG. 7 depicts a clock gate circuit for a logic cell in accordance with the present invention.

In one embodiment, if the output 136 of sequential logic circuit 122 is not selected in multiplexer 132 by memory block M3 (implying that flip-flop 122 is not being employed), a gate signal 134 (referred to alternately as LATCHS or LATCHSbit in other related applications) from the controlling memory block M3 can be applied to a clock gate circuit (not shown in FIG. 6) coupled between gate signal 134 and sequential logic 122. Such a clock gate circuit 150 is depicted in FIG. 7. The clock gate circuit includes an inverter comprising transistors T1 and T2 and a second inverter comprising transistors T5 and T6. A clock input is provided through node 152 and a clock gate signal is applied to node 134 which controls pull-up and pull-down transistors T3 and T4, respectively. If the clock gate signal is logic 1, implying that output 136 is indeed selected in multiplexer 132 of FIG. 6, transistor T4 in FIG. 7 is enabled, thus enabling both inverters and producing clock signal 156 and the complement of the clock signal 154 which are provided to operate the flip-flop of the sequential logic cell. If clock gate signal is set to logic 0, implying that output 136 is not selected by multiplexer 132 in FIG. 6, transistor T4 is disabled and a pull-up transistor T3 is enabled, which merely sets the clock outputs 154 and 156 to a constant state. By employing this circuit, the array automatically gates the clock signals to the sequential circuits in response to a user output selection so that the power drain associated with needless CMOS switching in the sequential circuit is avoided.

It will be evident to one of ordinary skill in the art that there are numerous ways of providing the connections required in the multiplexers and switches discussed above. For example, a signal path in a multiplexer could comprise a pass transistor, an EPROM, a fusible link or an antifuse which affects the desired isolation or connection between the attached lines. A user, upon requiring a connection through any particular multiplexer, would then only be required to perform the proper programming to effect the connection. A laser-programmed device could also employ optional welds at the intersection. The required connections are provided, by either including or excluding the weld. A mask-programmed device would simply include or omit the relevant connections. Any structure for signal selection in which before programming, a plurality of signals are available for selection, and after programming, one of the signals is selected, is referred to herein as a multiplexer. A "connection," as used throughout herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

Because it is generally desirable to maintain a constant delay between signal sources and all of their respective destinations, a preferred embodiment of the signal distribution architecture of the present invention is designed to minimize these delays thereby providing low-skew signal distribution. The low-skew signal distribution features of the present invention are discussed hereinbelow with reference to FIGS. 8–11.

Figure 8:
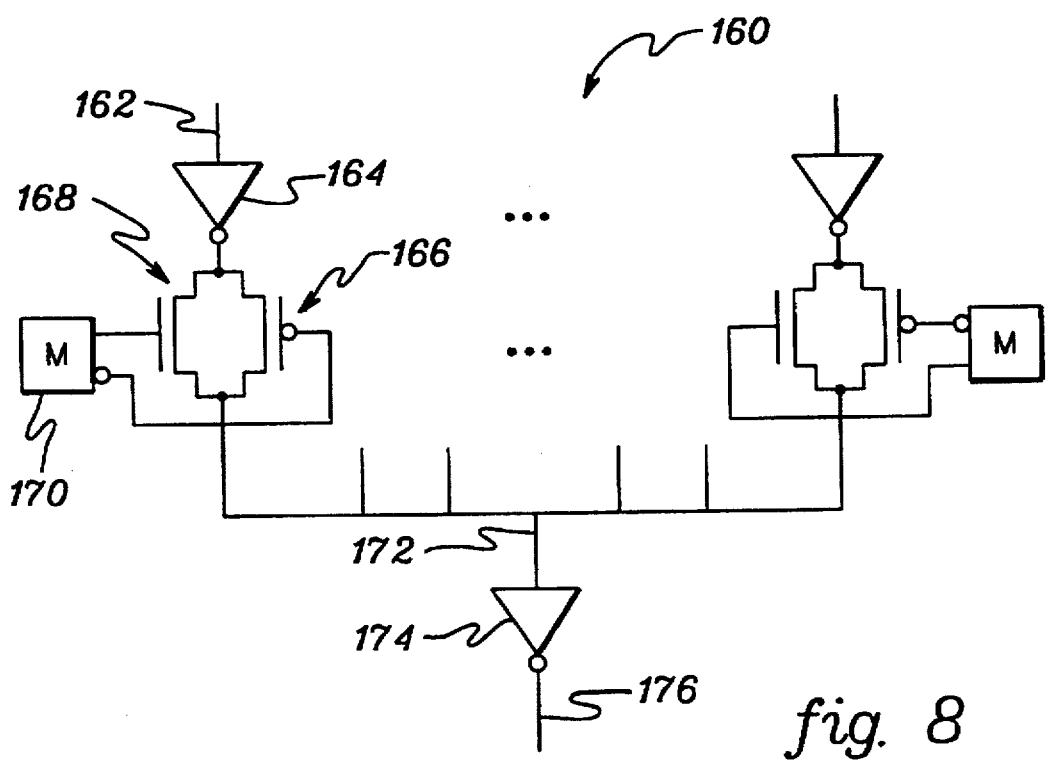
FIG. 8 depicts a programmable multiplexer for a signal distribution network in accordance with the present invention.

With reference to FIG. 8, depicted therein is a low-skew multiplexer 160 which can be used for any of the multiplexers in the networks of FIGS. 3–5. Multiplexer 160 includes a plurality of signal paths including the input signal path containing the components 162–170. The multiplexer has a commonly connected output path including components 172–176. The input signal path includes input node 162 followed by an inverter 164. The output of the inverter is connected to a first current carrying terminal of a field-effect transistor transmission gate including complementary transistors 166 and 168. The gates of the transistors can be controlled by a memory cell 170. (The field-effect transimssion gate/memory cell combination could be replaced by any programmable element known in the art, as discussed above). The second current carrying terminal of the transmission gate of each signal path of the multiplexer is connected to node 172, which in turn is connected to the input of an output inverter 174. The output 176 of inverter 174 is therefore the output of the multiplexer 160. By interrupting the potentially long signal paths in the networks of FIGS. 3–5 with regularly-spaced buffered multiplexers as described, signal rise and fall times, and signal delays, can more readily be predicted and controlled.

In one embodiment, the output inverter at each multiplexer can be eliminated and replaced by an inverter at each signal destination. This is the approach employed for reset line 124 of FIG. 6 which is applied to an inverter 123 proximate its destination, i.e., flip-flop 122.

Figure 9:
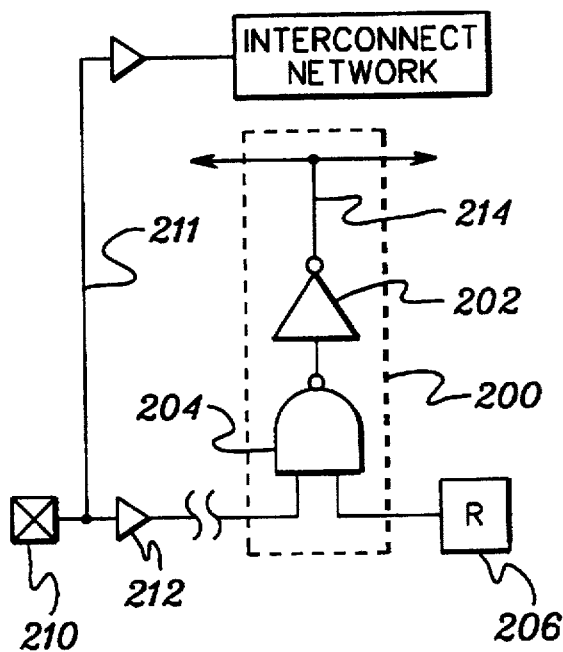
FIG. 9 depicts a programmable signal source for a signal distribution network in accordance with the present invention.
Figure 10:
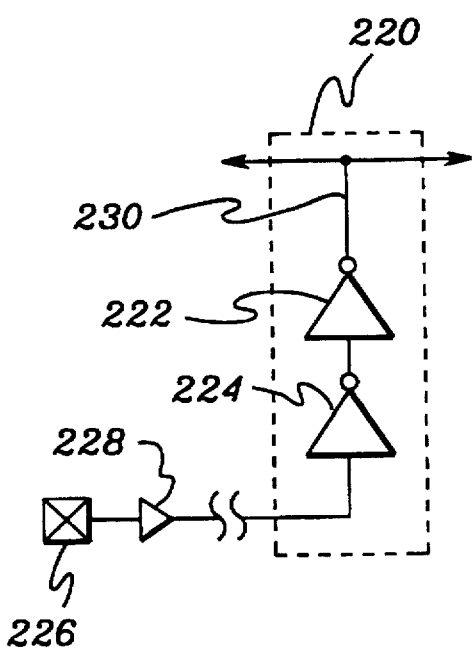
FIG. 10 depicts a buffered signal source for a signal distribution network in accordance with the present invention.

FIGS. 9 and 10 represent alternate embodiments of circuits employed to buffer clock or reset signals received at chip pads from external sources. FIG. 9 depicts an embodiment of a buffer used to distribute the clock signals to the column multiplexers 42 of FIG. 3. The circuit includes an input buffer 212 which buffers a clock signal presented on chip pad 210. The buffer 212 preferably buffers the signal to a central location on the chip wherein there is located another buffer circuit 200. Circuit 200 includes a NAND gate 204 followed by an inverter 202. The buffered clock signal is applied to one input of the NAND gate and a controllable register signal from a register 206 (or any other user-defined source) is applied to the second input of the NAND gate. The output of inverter 202, i.e., signal line 214, is then routed across the chip and fed to an input (e.g., 52) of each individual column multiplexer 42. The circuit of FIG. 9 is repeated for each of the six system clock signal lines 50 depicted in FIG. 3. Register 206 can be used to dynamically gate the clock signals into the array during array configuration or during array dynamic reconfiguration. Thus, any state which is defined by the clocked states of the sequential logic circuits of the array can be held using this register. The register can also be used for gating the clock during high function debugging, such that the sequential circuits employing the clock signal can be held in a set state and restarted in the same state. Any available type of programmable element can be used in place of the NAND/inverter/register combination of circuit 200. Note that the pad 210 may be dual function, in which case line 211 could carry the pad signal to the array interconnect structure. If the pad is dedicated for clock signals, the signal on line 211 can be simply ignored, i.e., not multiplexed into the interconnect network. The term "I/O block" is broadly defined herein as any pad or circuit for providing signals to the array, carrying signals from the array, or both.

FIG. 10 depicts a simplified circuit for applying a reset signal to the column multiplexers 72 through inputs 82 of FIG. 4. The circuit includes a buffer 228 which buffers a reset signal applied to chip pad 226. Circuit 220, again preferably centrally located on the chip, includes cascaded inverters 222 and 224 which merely buffer this signal to line 230. Line 230 is then fed to each column reset multiplexer 72. The circuit of FIG. 10 will be repeated three times for each of the three reset signals 80 of FIG. 4. Those skilled in the art will recognize that any number of the circuits of FIGS. 9 and 10 can be employed for an arbitrary number of clock or reset signals, and that either circuit can be employed for either clock or reset signals.

FIG. 11 depicts the physical arrangement of a low-skew signal distribution network such as the networks described in FIGS. 3-5, in a quadrant of a chip 300. FIG. 11 depicts the upper left quadrant of an array such as the array depicted in FIG. 1. However, the principles discussed below regarding FIG. 11 can be repeated for each quadrant, and can equally apply to any signal distribution network used for any type of integrated circuit.

The chip includes shaded region 322 which is referred to herein generally as a cruciform. The cruciform is merely a region defined on the chip which includes end-to-end horizontal and vertical stripes which cross at the middle of the chip. Dimensions 304a–d and 306a–d define regions of the chip which may generally correspond to the sectors of the programmable array of FIG. 1. The function of the remaining circuitry depicted is the low-skew distribution of signals from lines 310. Lines 310, buffered into the center of the chip from a chip pad, are each applied to a separate circuit 200. Circuit 200 can include a circuit such as that shown in FIG. 9, or alternatively, a circuit 220 as shown in FIG. 10, or any general buffering circuit. The outputs of these circuits include lines 312 projecting toward the left and a similar set of lines projecting toward the right of the chip. One of the lines 312, i.e., line 316, is applied to a linearly arranged set of primary signal distribution circuits 315 including primary signal distribution circuit 314. In the embodiments of FIGS. 3-5, these signal distribution circuits comprise the column multiplexers (e.g., 42, 72). Each primary signal distribution circuit receives the signal from horizontal line 316 and may in turn buffer the signal both up and down, including applying a signal to secondary distribution circuits 302a–d co-located in a single column 301. In the embodiments of FIGS. 3-5, the secondary distribution circuits comprise the sector multiplexers 44, 46, 74 and 76. The sector multiplexers of FIGS. 3-5 can include inputs from multiple column multiplexers as discussed above which is generally depicted in FIG. 11 as inputs 318. The secondary distribution circuits, e.g. circuit 302c, will in turn provide signals 320 to an upper and lower set of signal destinations, e.g., logic cells 22, in a sector of logic cells.

If all of the primary 315 and secondary 302 distribution circuits are designed according to the principles of FIG. 8, a low-skew signal network is thereby created. Buffering of the signals occurs at each primary and secondary distribution point.

Those skilled in the art will recognize that lines 316 and 318 merely represent conductive paths, and that the conductive path could either be a single, commonly connected line (as shown) or a plurality of separate lines connected to a common source but individually leading to each distribution point (not shown).

Each primary 315 and secondary 302 distribution circuit usually includes an output driver stage. If the primary and secondary distribution circuits are programmable multiplexers in a programmable array, the output stage may be an inverter such as inverter 174 depicted in FIG. 8. Pursuant to the principles of the present invention, the device sizes of the output driver stages of each of the distribution circuits are varied as a function of the distance from the respective signal source. In the array of FIG. 11, the primary distribution circuits 315 connected to line 316 are grouped and located in zones 306a–d (again, these regions may be sectors of an array as depicted in FIG. 1, in which case zone 306a is one half of the middle sector). The output driver stage of each of the distribution circuits is designed as a function of the propagation distance along line 316 from circuit 200, the source of the signal, wherein the outer circuits are intentionally quickened, and the inner circuits are intentionally slowed. In a preferred embodiment, each distribution circuit located in zone 306a has equivalently sized output stages, each distribution circuit within zone 306b has equivalently sized output stages, etc. Thus, for the row of distribution circuits 315 connected to line 316, four output stage sizes are employed. A similar technique can be employed to size the output driver stages of secondary distribution circuits 302a–d. Secondary distribution circuits 302 are each respectively located at a distance from the source primary distribution circuit 314 indicated by zones 304a–d. Because the secondary distribution circuits are placed in the middle of the sectors in a preferred embodiment, the zones 304 are offset from the sector boundaries by one half of the size of a sector. Thus, secondary distribution circuit 302a will have an output stage sized as a function of distance 304a, secondary distribution circuit 302b will have an output stage sized as a function of distance 304a plus 304b, etc. Only one column of secondary distribution circuits is shown, but the same output stage sizing technique is employed for the secondary distribution circuits associated with each column.

By employing this system of sizing as a function of signal propagation distance, the skew between the signals received at each signal destination (e.g., logic cell) is minimized.

Figure 12:
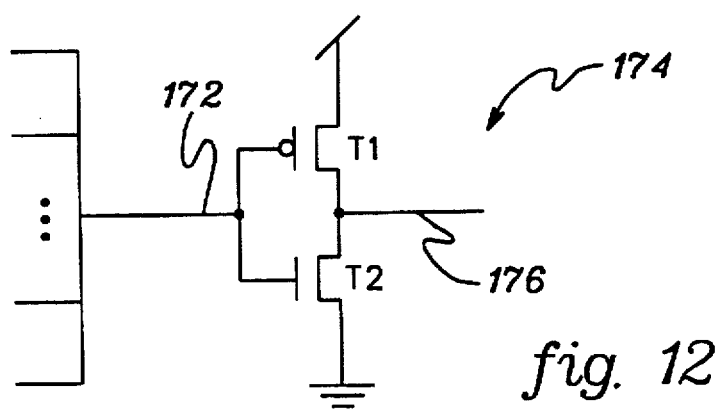
FIG. 12 depicts an exemplary output stage for a distribution circuit or multiplexer in accordance with the present invention.

If the signal distribution circuits comprise programmable multiplexers including output inverter stages 174 as shown in FIG. 8, the output inverter stage may be designed as depicted in FIG. 12. Shown therein is an inverter output stage of the multiplexer FIG. 8. The inverter includes p-channel transistor T1 and n-channel transistor T2. This circuit, in an exemplary embodiment, is employed as an output stage for the primary or column clock multiplexers 42 of FIG. 3, the secondary or sector clock multiplexers 44 and 46 of FIG. 3, and the primary or column reset multiplexers 72 of FIG. 4. More generally, the inverter could be used as an output stage for the primary distribution circuits 315 and the secondary distribution circuits 302 of FIG. 11.

Exemplary device widths, in micrometers (um) are contained in the following table for the transistors of the inverters (all device lengths are 700 nm):

| Zone | Primary Clock T1 | Primary Clock T2 | Primary Reset T1 | Primary Reset T2 | Secondary Clock T1 | Secondary Clock T2 |
|---|---|---|---|---|---|---|
| a | 24.5 | 20.4 | 27 | 17.4 | 6.3 | 3.15 |
| b | 27 | 22.5 | 29 | 18.7 | 7.5 | 3.75 |
| c | 30 | 25 | 30 | 19.3 | 8.1 | 4.05 |
| d | 31 | 25.8 | 31 | 20 | 8.4 | 4.2 |

The zones denoted a–d refer to the zones 306a–d and 304a–d in FIG. 11. In this exemplary embodiment, all of the devices in a given zone are equivalently sized. (Zones 304a and 306a begin in the middle of the middle sector of the seven sectors of the array.) The devices are sized so that the inverters in the outer zones (306d or 304d) are larger and faster, and the inverters in the inner zones (304a or 304d) are smaller and slower. The faster inverters in the outer zones compensate for the longer signal propagation time, and the slower inverters in the inner zones compensate for the shorter propagation time. The device widths were calculated for the exemplary seven sector array of FIG. 1, in which each sector is about 1500 um on a side. Those skilled in the art will recognize that the device sizes could be continuously varied in which case a continuum of device sizes would be necessary, or that a finer distance sampling (i.e., greater than four), could be employed.

The low skew distribution network described is particularly important for programmable arrays because: 1) the array hardware designers must provide a general clock network which reaches all regions of the chip in order to maintain a proper level of array generality. This is a physical constraint which prevents any substantial physical tuning of the clock network; and 2) the low-skew design provides very low clock tolerances and thus the array programmers or users need not be constrained by lower clock speeds or logic layout constraints.

As discussed above, various technologies are known to those skilled in the art to provide array programmability. Any of these techniques, or variants thereof, can be used to program the architecture of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to El Gamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

Programming the multiplexers of a preferred embodiment of the present invention involves SRAM cells, programmed by a user. FIGS. 6 and 8 depict exemplary connections of SRAM cells in multiplexers. The array SRAM cells can be configured in accordance with the techniques disclosed in the publication entitled "APPLICATION NOTE AT6000 SERIES CONFIGURATION," May 1993, Revision 1B, Atmel Corporation, which is hereby incorporated herein by reference in its entirety.

By employing the flexible distribution networks of FIGS. 3–7, greater clock and reset distribution options are possible within the array than those provided in the prior art, which is especially important for large, logically partitioned arrays having differing clock and reset requirements. Further, by employing the low-skew signal distribution features of FIGS. 8–12 for signal distribution networks in a programmable array, skew is minimized between signals applied to the logic cells of the array.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A low-skew signal distribution architecture for an integrated circuit, comprising:

a plurality of signal sources;

a first plurality of primary distribution circuits, each primary distribution circuit of the first plurality of primary distribution circuits comprising a multiplexer having a plurality of input stages coupled to at least some of said plurality of signal sources and an output stage; and first conductive paths between said signal sources and each primary distribution circuit of the first plurality of primary distribution circuits such that signals transmitted from said signal sources reach each respective primary distribution circuit after a respective delay, each respective delay being generally proportional to a respective propagation distance along respective said first conductive paths from said signal sources to the respective primary distribution circuit, wherein the output stage of each respective primary distribution circuit is sized as a function of the respective propagation distance along respective said first conductive paths to compensate for the respective delays such that skew is minimized between signals respectively output from the primary distribution circuits of the first plurality of primary distribution circuits.

2. The low-skew signal distribution architecture of claim 1 further comprising:

a first plurality of secondary distribution circuits, each secondary distribution circuit of the first plurality of secondary distribution circuits having an output stage; and a second conductive path between the output stage of a given primary distribution circuit of the first plurality of primary distribution circuits and each secondary distribution circuit of the first plurality of secondary distribution circuits such that a signal transmitted from the given primary distribution circuit reaches each respective secondary distribution circuit after a respective delay, each respective delay being generally proportional to a respective propagation distance along each second conductive path from the given primary signal distribution circuit to the respective secondary signal distribution circuit, wherein the output stage of each respective secondary signal distribution circuit is sized as a function of the respective propagation distance along each second conductive path to compensate for the respective delays such that skew is minimized between signals respectively output from the secondary distribution circuits of the first plurality of secondary distribution circuits.

3. The low-skew signal distribution architecture of claim 1, wherein at least one of the multiplexers comprises:

a circuit for selectively applying a fixed voltage level through the output stage thereof.

4. A low-skew signal distribution architecture for an integrated circuit, comprising:

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits, and wherein the primary distribution circuits of the first plurality of primary distribution circuits are distributed throughout a plurality of first regions of said integrated circuit, each region of the plurality of first regions being characterized by a respective distance from said signal source, and wherein the output stages of each of the primary distribution circuits in a given first region of the plurality of first regions are equivalently sized as a function of the distance from said signal source to the given first region.

5. A programmable array having a plurality of logic cells arranged therein, the programmable array including a clock/reset distribution architecture for distributing clock/reset signals to the plurality of logic cells, the clock/reset distribution architecture comprising the low-skew signal distribution architecture of claim 4.

6. The programmable array of claim 5 wherein at least some of the primary distribution circuits comprise programmable multiplexers.

7. A low-skew signal distribution architecture for an integrated circuit, comprising.

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits, and wherein the primary distribution circuits of the first plurality of primary distribution circuits are distributed throughout a plurality of first regions of said integrated circuit, each region of the plurality of first regions being characterized by a respective distance from said signal source, and wherein the output stages of each of the primary distribution circuits in a given first region of the plurality of first regions are equivalently sized as a function of the distance from said signal source to the given first region, the low-skew signal distribution architecture further comprising:

a first plurality of secondary distribution circuits, each secondary distribution circuit of the first plurality of secondary distribution circuits having an output stage; and a second conductive path between the output stage of a given primary distribution circuit of the first plurality of primary distribution circuits and each secondary distribution circuit of the first plurality of secondary distribution circuits such that a signal transmitted from the given primary distribution circuit reaches each respective secondary distribution circuit after a respective delay, each respective delay being generally proportional to a respective propagation distance along each second conductive path from the given primary signal distribution circuit to the respective secondary signal distribution circuit, wherein the output stage of each respective secondary signal distribution circuit is sized as a function of the respective propagation distance along each second conductive path to compensate for the respective delays such that skew is minimized between signals respectively output from the secondary distribution circuits of the first plurality of secondary distribution circuits, and wherein the secondary distribution circuits of the first plurality of secondary distribution circuits are distributed throughout a plurality of second regions of said integrated circuit, each region of the plurality of second regions being characterized by a respective distance from the given primary distribution circuit, and wherein the output stages of each of the secondary distribution circuits in a given second region of the plurality of second regions are equivalently sized as a function of the distance from the given primary distribution circuit to the given second region.

8. A programmable array having a plurality of logic cells arranged therein, the programmable array including a clock/reset distribution architecture for distributing clock/reset signals to the plurality of logic cells, the clock/reset distribution architecture comprising the low-skew signal distribution architecture of claim 7.

9. The programmable array of claim 8 wherein at least some of the primary and secondary distribution circuits comprise programmable multiplexers.

10. The low-skew signal distribution architecture of claim 7 wherein the first and second conductive paths comprise a single line commonly connected to said signal source and each primary or secondary distribution circuit.

11. The low-skew signal distribution architecture of claim 7 wherein each of the first and second conductive paths comprises a line connected between said signal source and the respective primary or secondary distribution circuit.

12. A low-skew signal distribution architecture for an integrated circuit, comprising:

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits, the low-skew signal distribution architecture further comprising:

a first plurality of secondary distribution circuits, each secondary distribution circuit of the first plurality of secondary distribution circuits comprising a multiplexer having a plurality of input stages and an output stage; and second conductive paths between the output stages of given primary distribution circuits of the first plurality of primary distribution circuits and each secondary distribution circuit of the first plurality of secondary distribution circuits such that signals transmitted from the given primary distribution circuits reach each respective secondary distribution circuit after a respective delay, each respective delay being generally proportional to a respective propagation distance along respective said second conductive paths from the given primary signal distribution circuits to the respective secondary signal distribution circuit, wherein the output stage of each respective secondary signal distribution circuit is sized as a function of the respective propagation distance along respective said second conductive paths to compensate for the respective delays such that skew is minimized between signals respectively output from the secondary distribution circuits of the first plurality of secondary distribution circuits.

13. A programmable array having a plurality of logic cells arranged therein, the programmable array including a clock/reset distribution architecture for distributing clock/reset signals to the plurality of logic cells, the clock/reset distribution architecture comprising the low-skew signal distribution architecture of claim 12.

14. A low-skew signal distribution architecture for an integrated circuit, comprising:

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits, and wherein at least one primary distribution circuit of the first plurality of primary distribution circuits comprises a circuit for selectively applying a fixed voltage level through the output stage thereof.

15. A programmable array having a plurality of logic cells arranged therein, the programmable array including a clock/reset distribution architecture for distributing clock/reset signals to the plurality of logic cells, the clock/reset distribution architecture comprising the low-skew signal distribution architecture of claim 14.

16. A low-skew signal distribution architecture for an integrated circuit, comprising:

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits, the low-skew signal distribution architecture further comprising:

a first plurality of secondary distribution circuits, each secondary distribution circuit of the first plurality of secondary distribution circuits having an output stage; and a second conductive path between the output stage of a given primary distribution circuit of the first plurality of primary distribution circuits and each secondary distribution circuit of the first plurality of secondary distribution circuits such that a signal transmitted from the given primary distribution circuit reaches each respective secondary distribution circuit after a respective delay, each respective delay being generally proportional to a respective propagation distance along each second conductive path from the given primary signal distribution circuit to the respective secondary signal distribution circuit, wherein the output stage of each respective secondary signal distribution circuit is sized as a function of the respective propagation distance along each second conductive path to compensate for the respective delays such that skew is minimized between signals respectively output from the secondary distribution circuits of the first plurality of secondary distribution circuits, and wherein at least one secondary distribution circuit of the first plurality of secondary distribution circuits comprises a circuit for selectively applying a fixed voltage level through the output stage thereof.

17. A programmable array having a plurality of logic cells arranged therein, the programmable array including a clock/reset distribution architecture for distributing clock/reset signals to the plurality of logic cells, the clock/reset distribution architecture comprising the low-skew signal distribution architecture of claim 16.

18. A programmable array having a plurality of logic cells arranged therein and a low-skew signal distribution architecture, the low-skew signal distribution architecture comprising:

a signal source;

a first plurality of primary distribution circuits, each primary distribution circuit of the first plurality of primary distribution circuits having an output stage; and a first conductive path between said signal source and each primary distribution circuit of the first plurality of primary distribution circuits such that a signal transmitted from said signal source reaches each respective primary distribution circuit after a respective delay, each respective delay being generally proportional to a respective propagation distance along each first conductive path from said signal source to the respective primary distribution circuit, wherein the output stage of each respective primary distribution circuit is sized as a function of the respective propagation distance along each first conductive path to compensate for the respective delays such that skew is minimized between signals respectively output from the primary distribution circuits of the first plurality of primary distribution circuits.

19. The programmable array of claim 18, wherein the low-skew signal distribution architecture comprises a clock/reset distribution architecture for distributing clock/reset signals to the plurality of logic cells.

20. The programmable array of claim 18, wherein the low-skew signal distribution architecture further comprises:

a first plurality of secondary distribution circuits, each secondary distribution circuit of the first plurality of secondary distribution circuits having an output stage; and a second conductive path between the output stage of a given primary distribution circuit of the first plurality of primary distribution circuits and each secondary distribution circuit of the first plurality of secondary distribution circuits such that a signal transmitted from the given primary distribution circuit reaches each respective secondary distribution circuit after a respective delay, each respective delay being generally proportional to a respective propagation distance along each second conductive path from the given primary signal distribution circuit to the respective secondary signal distribution circuit, wherein the output stage of each respective secondary signal distribution circuit is sized as a function of the respective propagation distance along each second conductive path to compensate for the respective delays such that skew is minimized between signals respectively output from the secondary distribution circuits of the first plurality of secondary distribution circuits.

21. The programmable array of claim 20, wherein the low-skew signal distribution architecture comprises a clock/reset distribution architecture for distributing clock/reset signals to the plurality of logic cells.

* * * * *